(12) United States Patent
Yamada

(10) Patent No.: US 9,824,860 B2
(45) Date of Patent: Nov. 21, 2017

(54) CHARGED PARTICLE BEAM EXPOSURE APPARATUS AND METHOD OF MANUFACTURING SEMICONDUCTOR DEVICE

(71) Applicant: ADVANTEST CORPORATION, Tokyo (JP)

(72) Inventor: Akio Yamada, Tokyo (JP)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 14/502,709

(22) Filed: Sep. 30, 2014

(65) Prior Publication Data
US 2015/0243480 A1    Aug. 27, 2015

(30) Foreign Application Priority Data
Feb. 26, 2014    (JP) .................. 2014-035755

(51) Int. Cl.
| | | |
|---|---|---|
| H01J 37/317 | (2006.01) | |
| H01J 37/20 | (2006.01) | |
| H01L 21/268 | (2006.01) | |
| H01J 37/304 | (2006.01) | |
| G21K 5/10 | (2006.01) | |
| H01J 37/30 | (2006.01) | |

(52) U.S. Cl.
CPC .......... *H01J 37/3174* (2013.01); *H01J 37/20* (2013.01); *H01J 37/3045* (2013.01); *H01L 21/268* (2013.01); *G21K 5/10* (2013.01); *H01J 37/3007* (2013.01); *H01J 2237/0435* (2013.01); *H01J 2237/1502* (2013.01); *H01J 2237/202* (2013.01); *H01J 2237/303* (2013.01)

(58) Field of Classification Search
None
See application file for complete search history.

(56) References Cited

U.S. PATENT DOCUMENTS

| | | | |
|---|---|---|---|
| 4,724,328 A | 2/1988 | Lischke | |
| 4,899,060 A | 2/1990 | Lischke | |
| 4,982,099 A | 1/1991 | Lischke | |
| 4,994,336 A | 2/1991 | Benecke et al. | |
| 5,049,460 A | 9/1991 | Benecke et al. | |
| 6,399,954 B1 * | 6/2002 | Seto ...................... B82Y 10/00 | |
| | | | 250/492.22 |
| 6,787,784 B1 | 9/2004 | Okunuki | |
| 7,276,714 B2 | 10/2007 | Platzgummer et al. | |

(Continued)

FOREIGN PATENT DOCUMENTS

| | | |
|---|---|---|
| DE | 3504705 | 8/1986 |
| DE | 3504714 | 8/1986 |

(Continued)

*Primary Examiner* — David E Smith
*Assistant Examiner* — James Choi
(74) *Attorney, Agent, or Firm* — Muramatsu & Associates

(57) ABSTRACT

The invention relates to a charged particle beam exposure apparatus configured to expose cut patterns or via patterns on a substrate having a plurality of line patterns 81a arranged on an upper surface of the substrate at a constant pitch by irradiating the substrate with a plurality of charged particle beams B1 to Bn while moving a one-dimensional array beam A1 in an X direction parallel to the line patterns 81a, the one-dimensional array beam A1 being a beam in which the charged particle beams B1 to Bn are arranged in an Y direction orthogonal to the line patterns 81a.

14 Claims, 14 Drawing Sheets

(56) References Cited

U.S. PATENT DOCUMENTS

| | | | |
|---|---|---|---|
| 2003/0025088 A1* | 2/2003 | Oae | B82Y 10/00 250/492.23 |
| 2003/0085360 A1* | 5/2003 | Parker | B82Y 10/00 250/396 R |
| 2005/0084766 A1* | 4/2005 | Sandstrom | G03F 7/2057 430/5 |
| 2006/0102853 A1* | 5/2006 | Heinitz | B82Y 10/00 250/491.1 |
| 2012/0219914 A1* | 8/2012 | Muraki | H01J 37/3174 430/296 |
| 2012/0286170 A1* | 11/2012 | Van De Peut | B82Y 10/00 250/397 |
| 2013/0252145 A1* | 9/2013 | Matsumoto | H01J 37/3007 430/30 |
| 2016/0155608 A1* | 6/2016 | Inoue | H01J 37/045 250/397 |
| 2016/0314934 A1* | 10/2016 | Yamada | H01J 37/3045 |

FOREIGN PATENT DOCUMENTS

| | | |
|---|---|---|
| EP | 0289885 | 11/1988 |
| EP | 0344513 | 12/1989 |
| EP | 0344515 | 12/1989 |
| JP | H6-236842 | 8/1994 |
| JP | 2001-015421 | 1/2001 |
| JP | 2008-066359 | 3/2008 |
| JP | 2013-093566 | 5/2013 |

* cited by examiner

Fig. 4
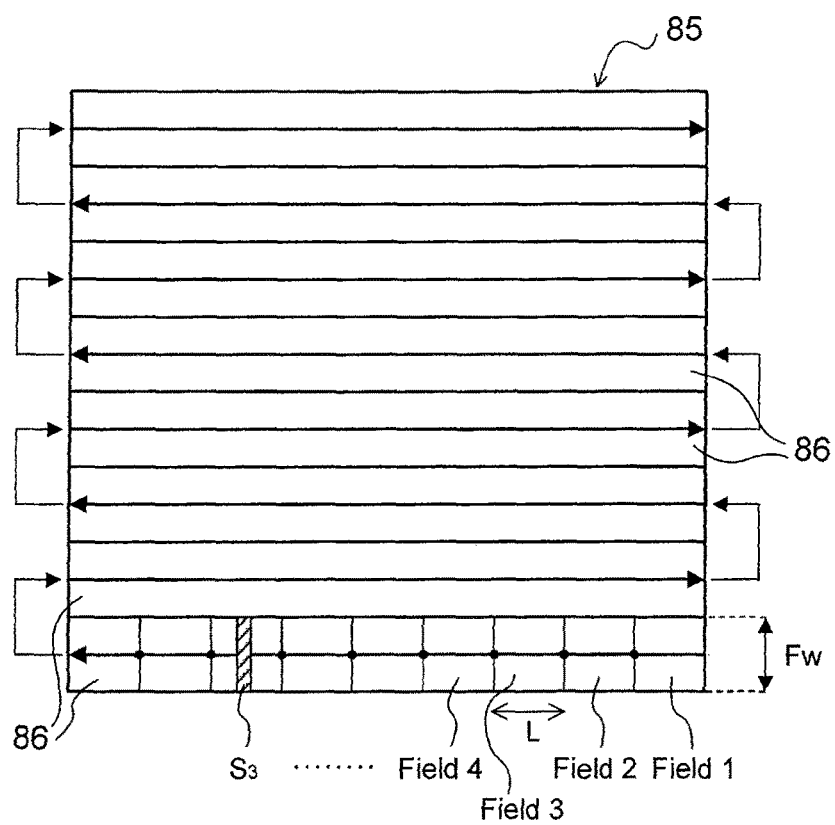
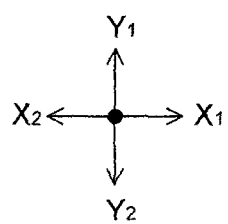

CHARGED PARTICLE BEAM EXPOSURE APPARATUS AND METHOD OF MANUFACTURING SEMICONDUCTOR DEVICE

CROSS REFERENCE TO RELATED APPLICATIONS

This application is based upon and claims the benefit of priority of the prior Japanese Patent Application No. 2014-035755, filed on Feb. 26, 2014, the entire contents of which are incorporated herein by reference.

TECHNICAL FIELD

The embodiments discussed herein are related to a charged particle beam exposure apparatus and a method of manufacturing a semiconductor device by using the same.

BACKGROUND ART

Along with progress of higher integration of semiconductor devices, there is a demand for an exposure technique which can form finer patterns and a new exposure technique is being developed. Currently, in an optical exposure technique used for manufacturing state-of-the-art semiconductor devices, light from an ArF light source is used. However, since the wavelength of this light is long, formation of a pattern having a line width of 20 nm or less is difficult even when various techniques for improving resolution are used.

An exposure technique using a charged particle beam has an advantage that, since a diffracted wavelength of the charged particle beam is extremely short, the resolution is essentially high. However, this technique has the following problem. Since it is difficult to obtain a charged particle beam of a sufficient intensity while maintaining high resolution, a practical processing speed cannot be obtained when a fine circuit pattern of a semiconductor device in which an area of a portion to be exposed is large is directly drawn only by using the charged particle beam.

A multi-beam exposure technique is being developed to improve the processing speed of exposure using the charged particle beam. A charged particle beam passes through an aperture array to be divided into a plurality of beams, and the divided beams are independently blanked with a blanker array. This is an exposure technique of forming patterns by independently turning on/off the charged particle beams for irradiating pixels assumed to be provided on an entire exposure surface of a semiconductor wafer at regular intervals as shown in U.S. Pat. No. 7,276,714 and Japanese Laid-open Patent Publication No. 2013-93566.

Meanwhile, a complementary lithography is proposed which complementarily uses the charged particle beam exposure technique and an immersion light exposure technique using the ArF light source.

In the complementary lithography, first, a simple line-and-space pattern is formed by using methods such as double patterning in immersion light exposure using the ArF light source. It is known that, in a case of a line-and-space pattern whose line width and pitch are determined in a vertical direction or a horizontal direction, a pattern having a line width of 10 nm or less can be formed in light exposure by using the double patterning technique and the like together. Then, cut patterns for cutting line patterns and via patterns for connecting the line patterns to one another are formed by using the charged particle beams.

In the complementary lithography, the area of the portion where the exposure is performed by using the charged particle beams is limited to approximately several percent of the area of the entire pattern including the line patterns. Accordingly, the exposure can be completed by irradiating the exposure surface of the semiconductor wafer with charged particles in a total amount of exposure far less than that in the case where the entire pattern including the line patterns is exposed by using only the charged particle beams, and the throughput can be improved by a degree corresponding to the reduced exposure amount.

Problems to be Solved by Invention

In the complementary lithography, the cut patterns and via patterns exist only on the line patterns forming the line-and-space pattern. The cut patterns and via patterns are formed by using the charged particle electron beams to have the size similar to the line width, to have the same shape and size, and to be isolated from each other.

A conventional charged particle multi-beam exposure apparatus has the following problem. When the cut patterns and via patterns existing only on the line pattern are exposed by using the charged particle beams arranged in a lattice pattern, a proportion of multiple beams for simultaneously irradiating the exposure surface to all of the original multiple beams is small, and most of the charged particle beams emitted from a charged particle source are wasted without being actually used for the exposure.

Moreover, even if the beams of the charged particle multi-beam exposure apparatus are arranged in a one-dimensional direction, it is impossible to obtain an exposure apparatus which efficiently exposes the cut patterns and via patterns located on the lines at any positions but are limited in a line pattern direction, at a practical processing speed while maintaining high resolution.

In view of this, an object of the present invention is to provide a charged particle beam exposure apparatus and a method of manufacturing a semiconductor device which can efficiently draw cut patterns and via patterns.

Means for Solving Problems

An aspect of the disclosure described below provides a charged particle beam exposure apparatus configured to expose cut patterns or via patterns on a substrate having a plurality of line patterns arranged on an upper surface of the substrate at a constant pitch, the cut patterns provided to cut the line patterns, the via patterns provided to form via holes on the line patterns, the charged particle beam exposure apparatus including: a charged particle source configured to emit charged particles; an aperture plate having a plurality of openings arranged in a one-dimensional direction orthogonal to the line patterns, the aperture plate configured to form a one-dimensional array beam in which charged particle beams formed of the charged particles having passed through the openings are arranged in array in the one-dimensional direction; a blanker plate including a blanker array configured to independently deflect in a blanking manner the charged particle beams included in the one-dimensional array beam; a final aperture plate configured to block the charged particle beams deflected by the blanker array; a deflector configured to adjust an irradiation position of the entire one-dimensional array beam; a stage including a drive mechanism configured to hold and move the substrate; and a control device configured to control operations of the blanker plate, the deflector, and the stage, wherein the control device causes the stage to continuously move in a direction parallel to the line patterns and, at the same time, performs irradiation of the charged particle beams while stopping the one-dimensional array beam for a certain period at pixel positions set at regular intervals on the line patterns, in accordance with the movement of the stage.

Moreover, another aspect provides a method of manufacturing a semiconductor device, including a step of exposing cut patterns or via patterns on a substrate having a plurality of line patterns arranged on an upper surface of the substrate at a constant pitch, the cut patterns provided to cut the line patterns, the via patterns provided to form via holes on the line patterns, the exposure performed by using a charged particle beam exposure apparatus including: a charged particle source configured to emit charged particles; an aperture plate having a plurality of openings arranged in a one-dimensional direction orthogonal to the line patterns, the aperture plate configured to form a one-dimensional array beam in which charged particle beams formed of the charged particles having passed through the openings are arranged in array in the one-dimensional direction; a blanker plate including a blanker array configured to independently deflect in a blanking manner the charged particle beams included in the one-dimensional array beam; a final aperture plate configured to block the charged particle beams deflected by the blanker array; a deflector configured to adjust an irradiation position of the entire one-dimensional array beam; a stage including a drive mechanism configured to hold and move the substrate; and a control device configured to control operations of the blanker plate, the deflector, and the stage, wherein the stage is continuously moved in a direction parallel to the line patterns and, at the same time, irradiation of the charged particle beams is performed with the one-dimensional array beam being stopped for a certain period at pixel positions set at regular intervals on the line patterns, in accordance with the movement of the stage.

Effects of Invention

According to the aspects described above, the irradiation of the plurality of charged particle beams arranged in the direction orthogonal to the line patterns is performed while moving the one-dimensional array beam formed of the plurality of charged particle beams in the direction parallel to the line pattern. Since the one-dimensional array beam is used as described above, the proportion of the charged particle beams actually used for the exposure to all of the charged particle beams can be increased. The usage efficiency of the charged particle beams generated from the charged particle source is thus improved and the time required for the exposure can be reduced.

Moreover, performing the irradiation of the charged particle beams while stopping the one-dimensional array beam for a certain period at pixel positions set at regular intervals on the line patterns in accordance with the movement of the stage can make rising of exposure amount distribution steep. The cut patterns and via patterns can be thereby drawn in high resolution and in high accuracy.

BRIEF DESCRIPTION OF DRAWINGS

FIG. 4 is a view showing an operation of a stage in the electron beam exposure apparatus of the first embodiment.

MODES FOR CARRYING OUT THE INVENTION

Figure 1A:
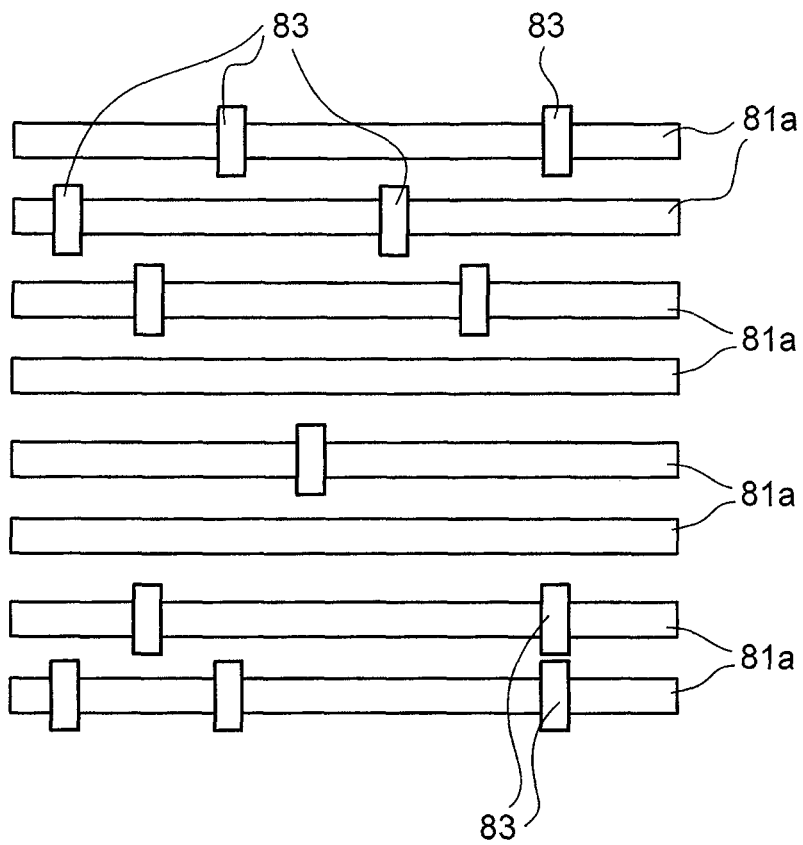
FIG. 1A is a plan view showing cut patterns formed on line patterns in complementary lithography.
Figure 1B:
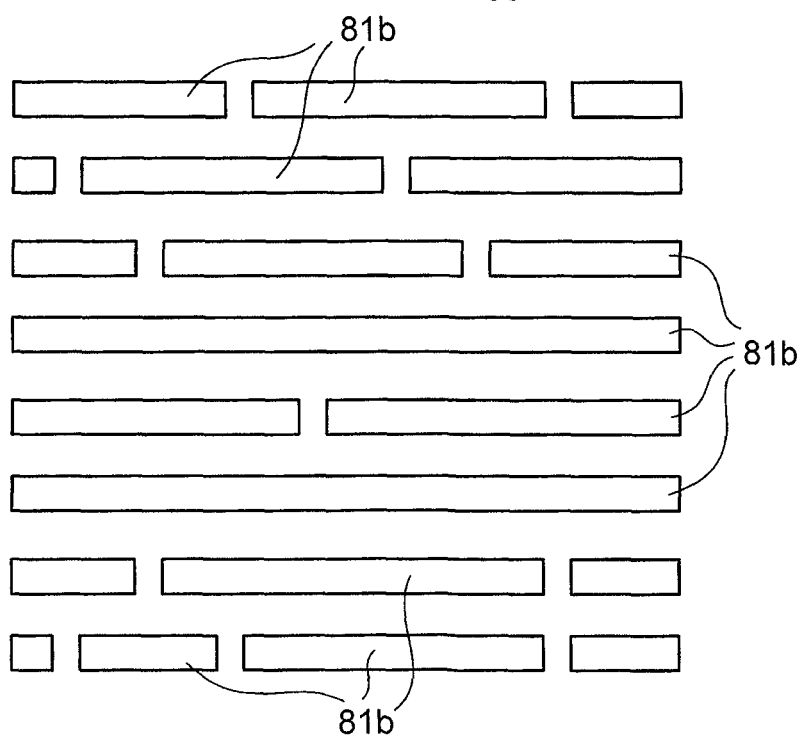
FIG. 1B is a plan view showing line patterns cut by using the exposed cut patterns of FIG. 1A in the complementary lithography.

FIG. 1A is a plan view showing cut patterns formed on line patterns in complementary lithography, FIG. 1B is a plan view showing line patterns 81b cut to a desired lengths by the exposed cut patterns of FIG. 1A in the complementary lithography.

As shown in FIG. 1A, in the complementary lithography, the plurality of line patterns 81a are arranged at a certain pitch to form a line-and-space pattern. These line patterns are formed by, for example, an exposure technique combining double patterning and immersion light exposure using an ArF light source.

Thereafter, cut patterns 83 which are opening portions for cutting the line patterns 81a are formed in a resist film (not-illustrated) formed on the line-and-space pattern. The cut patterns 83 are not simple lines but are fine rectangular patterns. Accordingly, application of the light exposure technique using the ArF light source is difficult. An electron beam (charged particle beam) which is excellent in resolution is thus used for the exposure.

Thereafter, the line patterns 81a are cut in portions of the cut patterns 83.

The line patterns 81b cut into desired lengths are thereby obtained as shown in FIG. 1B.

Next, an inter-layer insulating film is formed and a plurality of line patterns extending in a direction (FIG. 1A)

orthogonal to the line patterns 81a are formed on the inter-layer insulating film. Moreover, vias connecting the upper and lower line patterns to one another are formed in the inter-layer insulating film at portions where the upper and lower line patterns intersect one another. These vias are exposed by a method similar to that of the cut patterns 83.

The cut patterns and via patterns formed by the complementary lithography as described above have the following characteristics.

(Requirement 1) The formed cut patterns or via patterns have the same shape in the same layer.

(Requirement 2) The formed cut patterns or via patterns exist on the line patterns.

(Requirement 3) The area of the formed cut patterns or via patterns is several percent of the total area of the line patterns. A practical level of throughput can thus be achieved even in electron beam exposure.

(Requirement 4) No formed cut patterns or via patterns are successively connected to each other. This is because portions functioning as a semiconductor device are patterns of portions remaining after the cutting and patterns connecting the portions remaining after the cutting, and there is no cutting which eliminates the remaining portions or connection which forms a direct short circuit between the remaining portions.

(Requirement 5) The formed cut patterns can exist at random positions on the line patterns. In other words, an arrangement pitch of the cut pattern in a line direction (longitudinal direction) of the line patterns is not constant.

(Requirement 6) The formed cut patterns need to be formed with high accuracy in the longitudinal direction of the line patterns. This is because the cut patterns may interfere with via patterns and the like in portions where the line patterns intersect one another if the accuracy of the cut patterns is low in the longitudinal direction.

(Requirement 7) The position accuracy and line width accuracy of the formed cut patterns in a direction (width direction of the lines) orthogonal to the direction of the line patterns may not be as high as the accuracy in the longitudinal direction of the line patterns. This is because the line patterns can be cut even if the accuracy in the width direction of the line patterns is low, and there is no effect on the lengths of the cut line patterns.

In the following embodiments, description is given of a charged particle beam exposure apparatus (electron beam exposure apparatus) suitable for drawing the cut patterns or via patterns satisfying the requirements described above.

First Embodiment (1) Configuration of Electron Beam Exposure Apparatus

Figure 2:
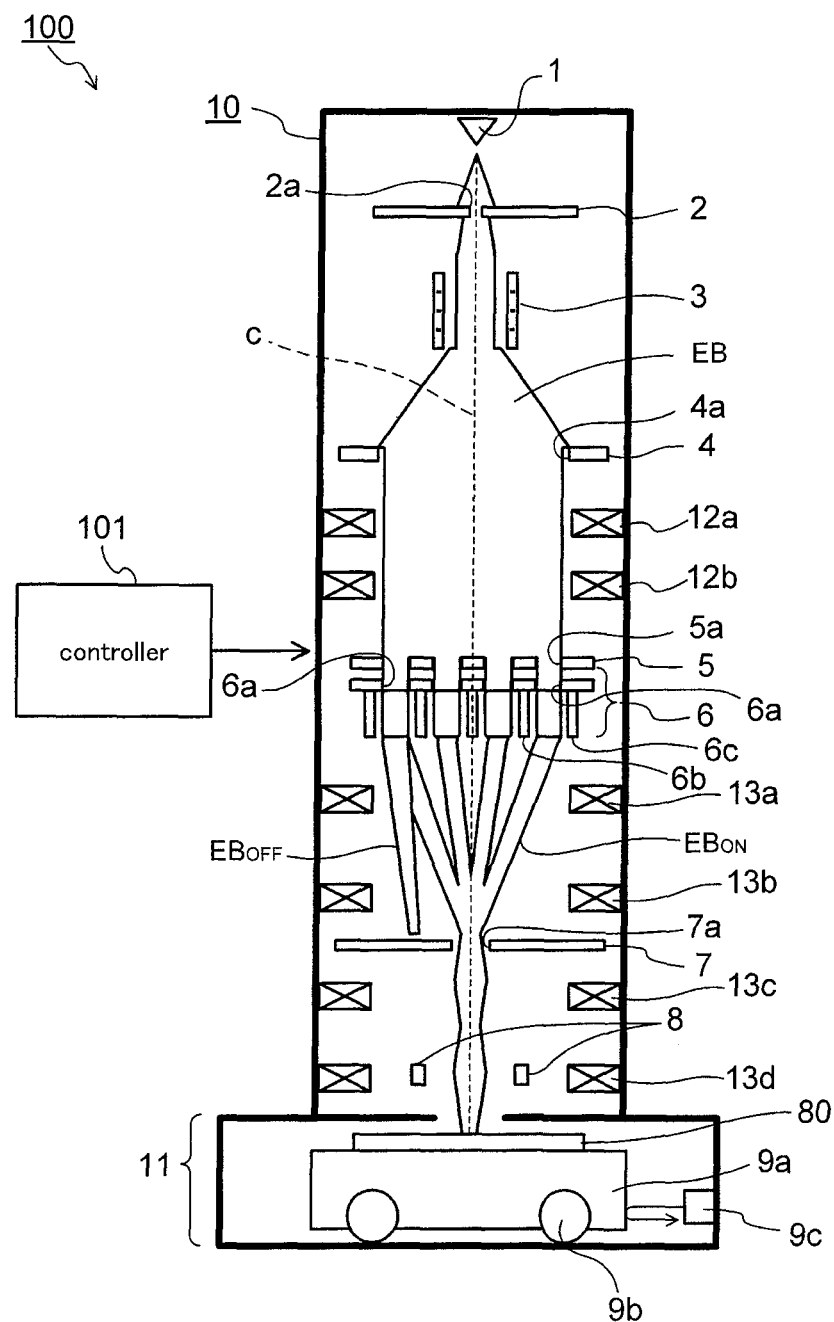
FIG. 2 is a block diagram of a column in an electron beam exposure apparatus of a first embodiment.

FIG. 2 is a cross-sectional view of one column in an electron beam exposure apparatus of the embodiment.

The electron beam exposure apparatus 100 of the embodiment irradiates a surface of a semiconductor substrate 80 being an exposure target with electron beam EB (charged particle beam) by using the column 10 shown in FIG. 2. The column 10 includes a cylindrical case, and an electron gun 1 configured to generate the electron beam EB is provided inside the case near an upper end thereof.

The electron beam EB is emitted from the electron gun 1 at a predetermined accelerating voltage (for example, 50 keV), and is shaped to have a circular cross section about an optical axis c by passing through an opening 2a of a first aperture plate 2.

The electron beam EB having passed through the first aperture plate 2 passes through an asymmetric illumination optical system 3 provided below the first aperture plate 2. The asymmetric illumination optical system 3 includes, for example, an electrostatic quadrupole electrode and deforms the electron beam EB into a shape having a cross-section elongated in a predetermined direction by appropriately adjusting an electrostatic quadrupole field.

Figure 3A:
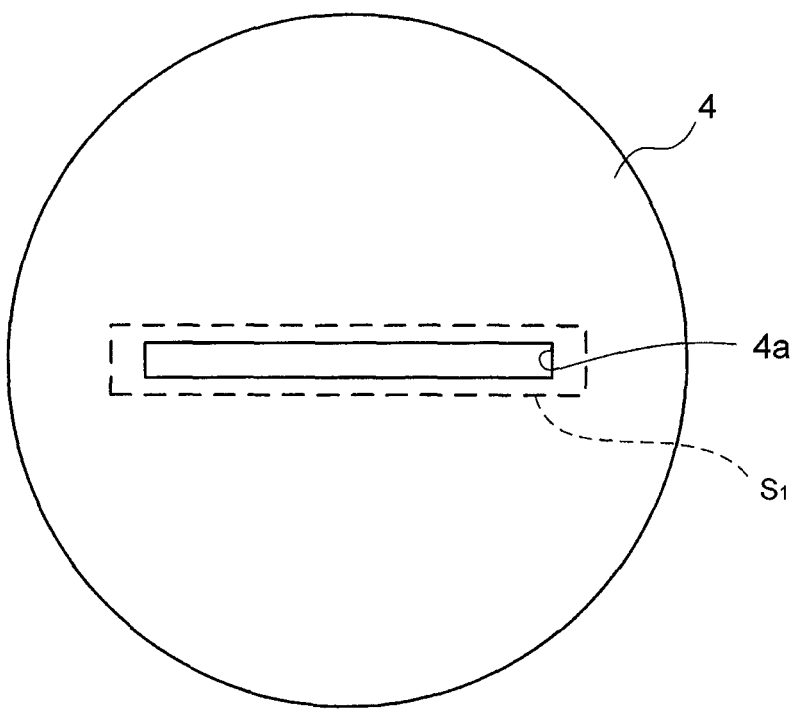
FIG. 3A is a plane view of a slit plate in the column of FIG. 2.

A slit plate 4 is irradiated with the electron beam EB having passed through the asymmetric illumination optical system 3. FIG. 3A is a plane view of the slit plate 4. As shown in FIG. 3A, the slit plate 4 includes an elongated rectangular opening 4a, an irradiation region $S_1$ surrounding the opening 4a is irradiated with the electron beam EB. The electron beam EB is shaped to have an elongated rectangular cross section by passing through the slit plate 4.

Removing an excessive portion of the electron beam EB with the slit plate 4 as described above can reduce damages caused by sputtering and excessive heating of a beam shaping aperture plate 5.

Thereafter, the electron beam EB is focused on the beam shaping aperture plate 5 by electromagnetic lenses 12a and 12b.

Figure 3B:
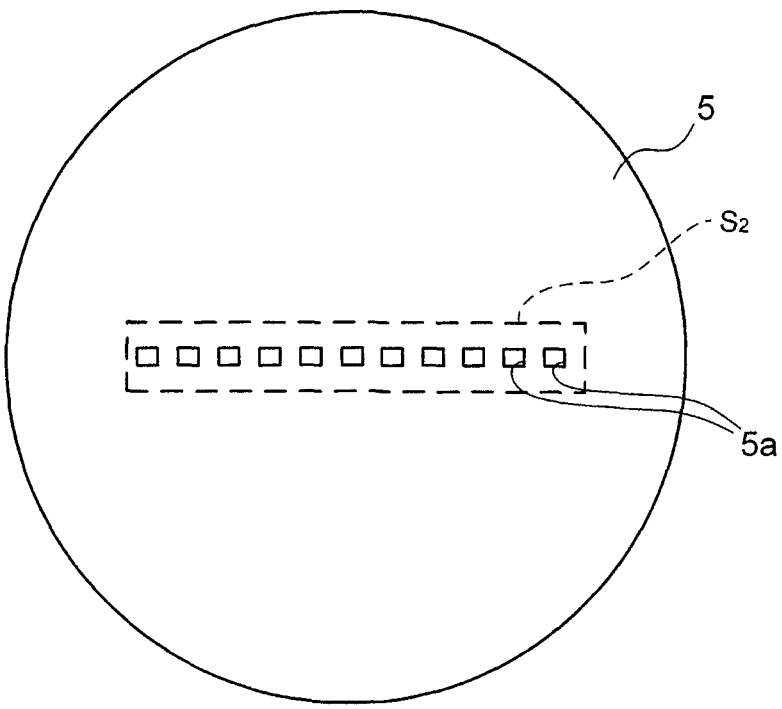
FIG. 3B is a plan view of an aperture plate.

FIG. 3B is a plan view of the beam shaping aperture plate 5. As shown in FIG. 3B, the beam shaping aperture plate 5 is provided with a plurality of opening portions 5a one-dimensionally arranged in the same direction as a longitudinal direction of the electron beam EB. The beam shaping aperture plate 5 generates a one-dimensional array beam A1 including electron beams B1 to Bn (see FIGS. 4 and 5) whose number is the same as the number of opening portions 5a. Note that, due to requirement 1 that all of the patterns in the same layer are the same, the shapes of the respective opening portions 5a are all the same.

In the embodiment, usage efficiency of the electron beam is improved by shaping the electron beam EB into the elongated shape with the asymmetric illumination optical system 3 and then irradiating the opening portions 5a arranged one-dimensionally with the electron beam EB. Due to this, a resist can be exposed in electron beam irradiation of a shorter time and the throughput is thus improved.

As shown in FIG. 2, a blanker plate 6 is disposed below the beam shaping aperture plate 5.

The blanker plate 6 includes opening portions 6a in portions corresponding to the opening portions 5a of the beam shaping aperture plate 5. Blanking electrodes 6b and 6c for independently deflecting the electron beams B1 to Bn are provided lateral to each of the opening portions 6a.

Electromagnetic lenses 13a to 13d, a final aperture 7, and a deflector 8 are provided below the blanker plate 6. The electromagnetic lenses 13a to 13d reduce the one-dimensional array beam A1 (see FIG. 5) by a predetermined magnification and focus the one-dimensional array beam A1 on a surface of the semiconductor substrate 80.

The final aperture 7 includes a circular opening 7a. The final aperture 7 blocks an electron beam $B_{off}$ deflected by the blanking electrodes 6b and 6c and allows only an electron beam $B_{on}$ not deflected by the blanker plate 6 to pass.

The deflector 8 is provided below the final aperture 7. The semiconductor substrate 80 is irradiated with the one-dimensional array beam A1 with an irradiation position thereof on the semiconductor substrate 80 where the irradiation position is adjusted by the deflector 8 in a predetermined deflection range.

A chamber 11 is connected to a lower portion of the aforementioned column 10, and the semiconductor substrate 80 which is an exposure target and a stage 9a configured to hold the semiconductor substrate 80 are provided in the chamber 11. The stage 9a is driven in a horizontal direction (X-Y direction) and a rotation direction by a drive device 9b.

A position sensor 9c including, for example, a laser interferometer and the like is provided lateral to the stage 9a to detect the position of the stage 9a with a positional accuracy of about 0.1 nm (nanometer). A measurement result of the position sensor 9c is used for control of the drive device 9b and the deflector 8 and the like.

Operations of the column 10, the stage 9a, and the drive device 9b described above are controlled by a control part 101.

(2) Electron Beam and Operation of Stage

Next, the electron beam and an operation of the stage 9a are described.

FIG. 4 is a plan view showing the operation of the stage 9a in the exposure of the electron beam exposure apparatus 100.

In FIG. 4, a rectangular exposure region 85 shows a region in which the column 10 performs the exposure, and the size of the exposure region 85 is, for example, about 30 mm×30 mm.

Arrows in FIG. 4 show moving directions of an irradiation region $S_3$ of the one-dimensional array beam A1. As shown in FIG. 4, exposure is performed by irradiating a region having a width of Fw (hereafter, referred to as frame width) with the one-dimensional array beam while moving the irradiation region $S_3$ linearly in an $X_2$ direction from a corner of the exposure region 85. In this description, a region subjected to exposure in one linear movement is referred to as frame 86.

When the irradiation region $S_3$ reaches an end of the exposure region 85, the irradiation region $S_3$ is moved in an $Y_1$ direction by the frame width Fw and then made to turn back to perform exposure of the next frame 86. Note that the stage 9a is preferably continuously moved during the exposure of the frame 86 in order to prevent deterioration of accuracy due to vibrations.

Figure 5:
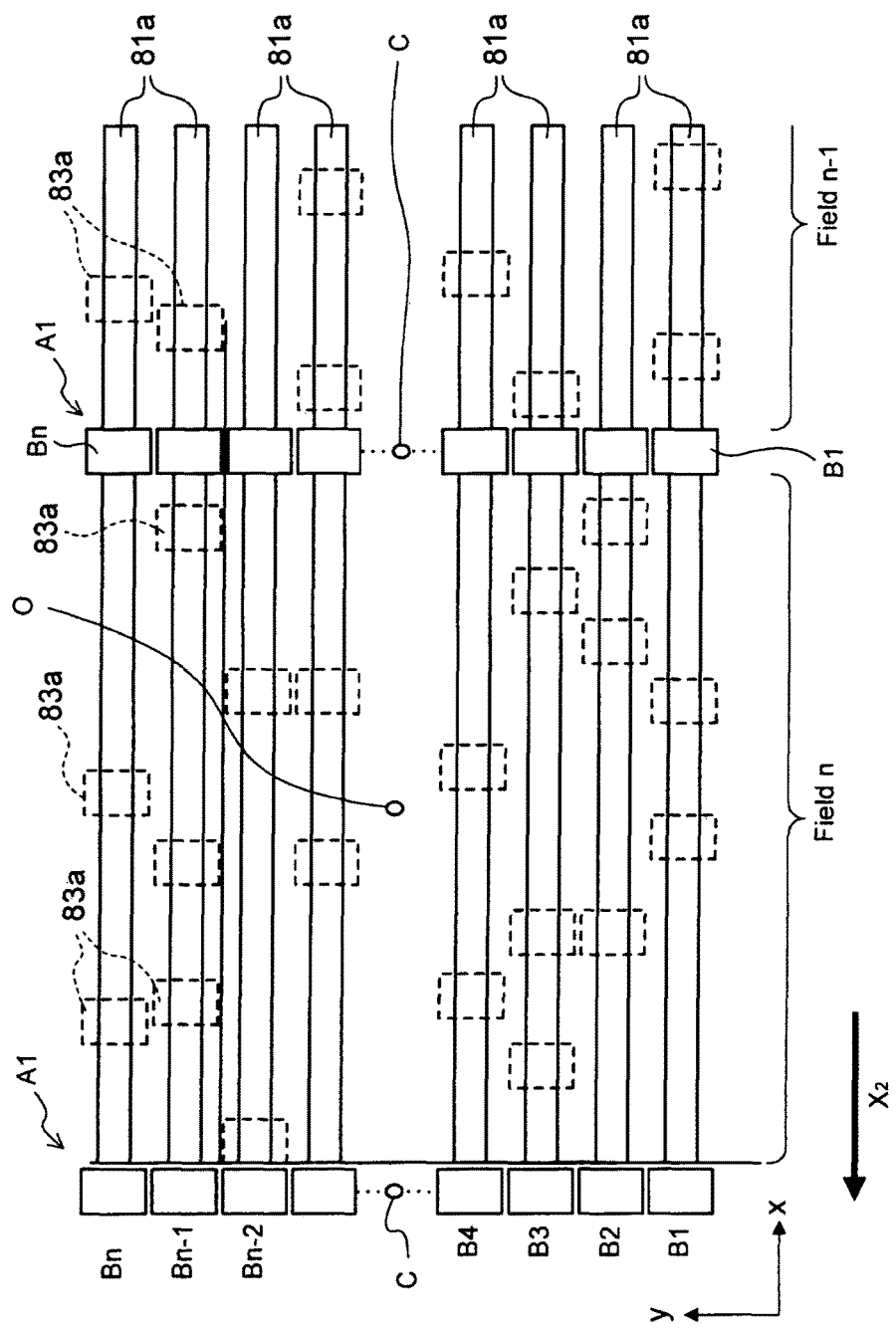
FIG. 5 is an enlarged view of a portion around an irradiation region $S_3$ of FIG. 4.

FIG. 5 is an enlarged view of a portion around the irradiation region $S_3$ of FIG. 4.

As shown in FIG. 5, irradiation positions of the n electron beams B1, B2, . . . , and Bn included in the one-dimensional array beam A1 are determined on the line patterns 81a of the semiconductor substrate 80. Requirement 2 that the patterns are disposed on the line patterns is thereby satisfied.

The irradiation positions of the electron beams B1 to Bn moves along the line patterns 81a as the stage 9a moves in the $X_2$ direction. In other words, the one-dimensional array beam A1 moves in a direction parallel to the line patterns 81a.

Then, exposure of cut patterns 83a is performed by performing irradiation of the electron beams B1 to Bn at predetermined timings.

Note that, if the irradiation of the electron beams B1 to Bn is performed with the one-dimensional array beam A1 being moved, edges of the electron beams B1 to Bn also move with the movement of the semiconductor substrate 80. Accordingly, rising and falling in exposure amount distributions of the electron beams becomes gradual, i.e., unsharp. As a result, accuracy at edge positions of the pattern 83a in the X direction deteriorates. In the complementary lithography, the cut patterns or via patterns need to be formed with high accuracy in the longitudinal direction of the line patterns (requirement 6), but sufficient accuracy cannot be obtained in the exposure performed with the electron beams moving.

Although reducing the movement speed of the stage to make the rising and falling in the exposure amount distributions of the electron beams steep is conceivable, the processing speed greatly deteriorates in this case.

In view of this, in the embodiment, the exposure is performed with the irradiation position of the one-dimensional array beam A1 being stopped on the line patterns 81a by moving the one-dimensional array beam A1 synchronously with the movement of the stage 9a by using the deflector 8 while the irradiation of the electron beams is performed.

Figure 6:
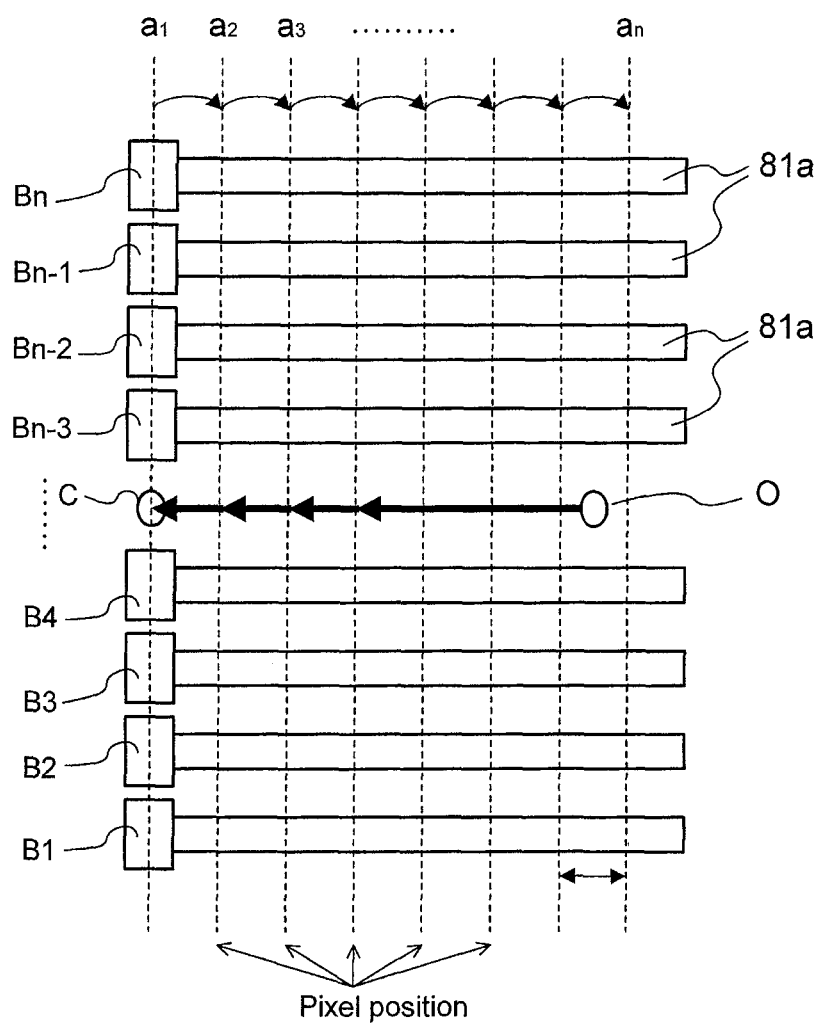
FIG. 6 is a view showing a movement of a one-dimensional array beam in the electron beam exposure apparatus of the first embodiment.

FIG. 6 is a view showing the movement of the irradiation position of the one-dimensional array beam A1 in the embodiment.

As shown in FIG. 6, in the embodiment, pixel positions $a_1$ to $a_n$ are set at a certain pitch on each of the line patterns 81a. The irradiation position of the one-dimensional array beam A1 is stopped at the pixel positions $a_1$ for a certain period by using the deflector 8, and the irradiation of the electron beams is performed in this period. Thereafter, the irradiation position of the one-dimensional array beam A1 is made to jump to the next pixel position $a_2$, and the irradiation of the electron beams is performed while the irradiation position is stopped at the pixel position $a_2$. The patterns are formed by repeating this operation and performing the irradiation of the electron beams while the irradiation position is sequentially stopped at the pixel positions $a_1$ to $a_n$.

The rising and falling in the exposure amount distributions of the electron beams can be thereby made steep, and it is possible to satisfy requirement 6 that the patterns 83a are formed accurately in the longitudinal direction of the line patterns 81a.

Note that a portion denoted by reference sign O in FIG. 6 shows an exposure reference position of the deflector 8, and a plurality of the exposure reference positions are arranged in the frame 86 at intervals equal to a deflection width of the deflector 8. The deflector 8 operates based on the exposure reference positions. A portion denoted by reference sign C in FIG. 6 shows a pixel position where the exposure is to be currently performed. In this case, a pixel feed deflection data component as shown by the arrow extending from the exposure reference position O to the pixel position C is inputted into the deflector 8. The pixel feed deflection data component corresponds to a component which changes stepwise in FIG. 11 to be described later. A deflection data component (component which changes continuously in FIG. 11) of a difference between a current stage position and the exposure reference position O is added to this pixel feed deflection data component, and the resultant data component is inputted into the deflector 8. Adding the two deflection data components described above maintains substantial amplitude of a control signal inputted into the deflector 8 close to zero.

(3) Method of Forming Pattern Between Pixel Positions

In the exposure method described above, the irradiation positions of the electron beams are limited to the pixel positions. Accordingly, the positions of the cut patterns and the via patterns are limited only to the pixel positions, if the method is performed as it is. Hence, it is impossible to satisfy requirement 5 that the patterns may exist at random positions on a line shape.

Moreover, if the positions of the cut patterns are limited only to the pixel positions, a strong restriction is imposed on the design of a semiconductor device, and it is difficult to design the semiconductor device in such a way that this restriction is satisfied. Accordingly, it is preferable that the cut patterns can be each drawn at an arbitrary position between pixel positions.

In view of this, in the embodiment, in a case of drawing a pattern at a position between pixel positions, the drawing is performed by overlapping portions exposed by an electron beam delivered to two pixel positions adjacent to this pattern.

Figure 7:
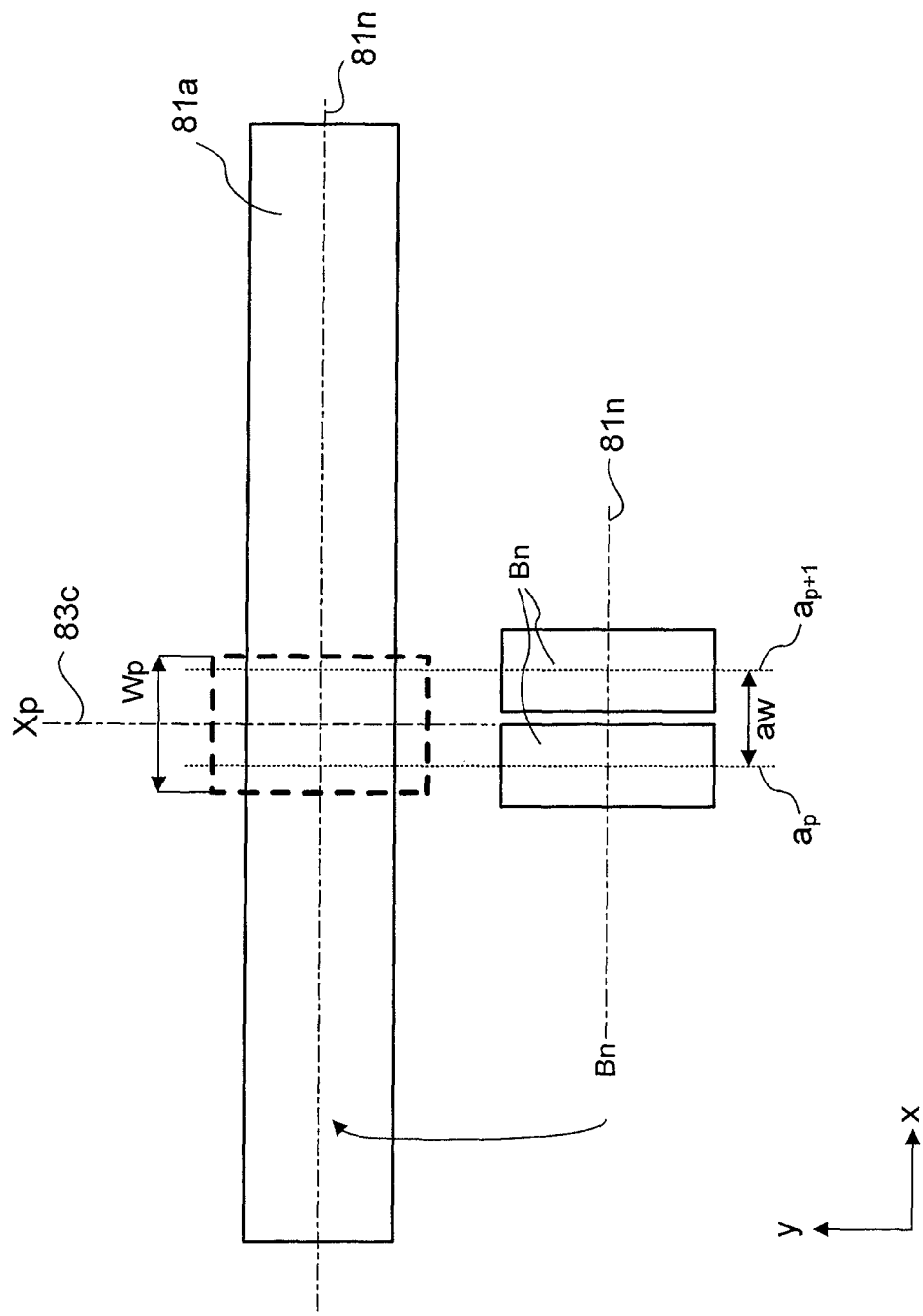
FIG. 7 is a plan view showing an example in which a pattern is drawn between pixel positions by using an n-th electron beam Bn in the one-dimensional array beam.

FIG. 7 shows an example in which a cut pattern located at a pattern position $X_p$ and having a pattern width Wp is formed by using an n-th electron beam Bn included in the one-dimensional array beam A1. In FIG. 7, $a_p$ represents the p-th pixel position, $a_{p+1}$ represents the (p+1)th pixel position, and aw represents a pixel pitch. Moreover, the position $X_p$ of the target pattern is assumed to be within a range of $a_p \leq X_p \leq a_{p+1}$.

The delivered electron beam Bn is illustrated as a rectangle having a width of W in the line pattern direction (x direction). The width W shows a width in which the pattern is developed when the electron beam is delivered at a reference exposure amount. However, the electron beam actually spreads in a predetermined range determined by conditions of the optical system of the column 10. The size of this spreading of the electron beam is referred to hereafter as Blur.

In the embodiment, the size of the pixel pitch aw is set to be within such a range that blurring portions of the electron beam Bn at adjacent pixel positions overlap each other, and one cut pattern is drawn by overlapping portions of Blur (also referred to as blurring portions) of the electron beam Bn at adjacent pixel positions. Then, the position of the cut pattern is finely adjusted by adjusting a proportion between the exposure amounts of the electron beam Bn respectively at the adjacent pixel positions.

A method of determining the proportion between the exposure amounts is described below.

In a case where irradiation of the electron beam Bn is performed at the p-th pixel position $a_p$ in an exposure amount $D_p$, an exposure amount distribution $F_p(x)$ in the line pattern direction (x direction) is expressed by the following formula.

$$F_p(x) = D_p \times (1/2) \times [(\mathrm{Erf}((x-a_p-W/2)/\mathrm{Blur}) - \mathrm{Erf}((x-a_p+W/2)/\mathrm{Blur})]$$

Note that Erf represents an error function in the above formula. In the above formula expressing the exposure amount distribution $F_p(x)$ and a formula expressing an exposure amount distribution $F_{p+1}(x)$, the first term expresses rising in the exposure amount distribution and the second term expresses falling in the exposure amount distribution.

Moreover, in a case where irradiation is performed at the (p+1)th pixel position $a_{p+1}$ in an exposure amount $D_{p+1}$, the exposure amount distribution $F_{p+1}(x)$ in the line pattern direction is expressed by the following formula.

$$F_{p+1}(x) = D_{p+1} \times (1/2) \times [(\mathrm{Erf}((x-a_{p+1}-W/2)/\mathrm{Blur}) - \mathrm{Erf}((x-a_{p+1}+W/2)/\mathrm{Blur})]$$

In each of the two formulae described above, the parameters W and Blur are the same in the first term and the second term. Accordingly, the exposure amount distribution appears symmetric with respect to the center. Moreover, the maximum value of the distribution $F_p(x)$ is $D_p$, the maximum value of the distribution $F_{p+1}(x)$ is $D_{p+1}$, and the exposure amount distribution change depending on the position of the pattern. Since the shapes of $F_p(x)$ and $F_{p+1}(x)$ are both described by the error functions (Erf), the exposure amount distributions at the pixel positions $a_p$ and $a_{p+1}$ have the same shape profile.

Next, description is given of an example of obtaining $F_p(x)$ and $F_{p+1}(x)$ from the above formulae and calculating the width and size of a pattern appearing by performing development under a predetermined development condition (threshold of the exposure amount by which the development is performed), with the proportion between the exposure amounts $D_p$ and $D_{p+1}$ being varied.

Figure 8:
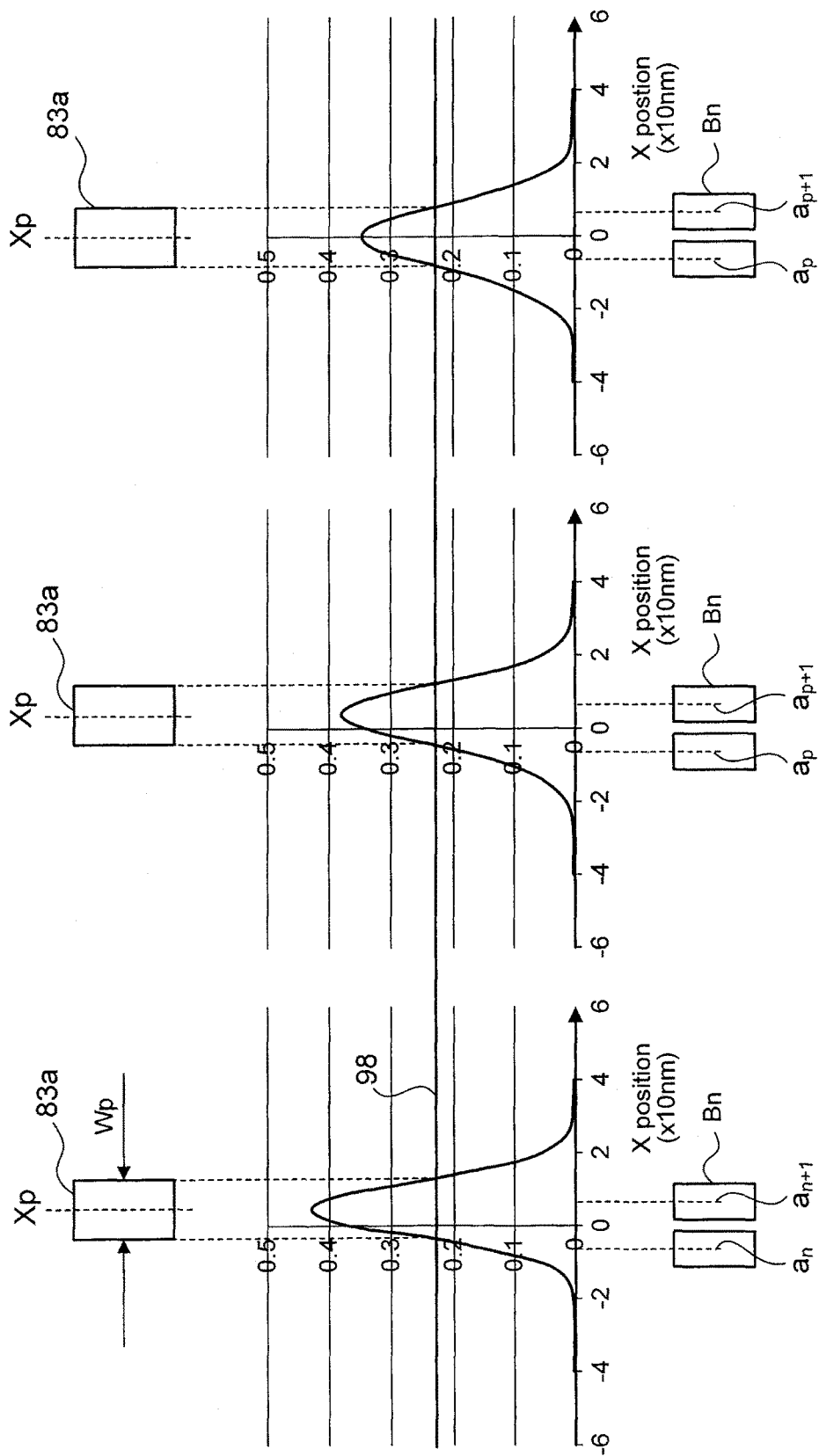
FIG. 8 is a view showing the total of exposure amount distributions $F_p(x)$ and $F_{p+1}(x)$ obtained through calculation, the width of the pattern, and the position of the pattern.

FIG. 8 is a view showing a total of the exposure amount distributions $F_p(x)$ and $F_{p+1}(x)$ obtained through calculation, the width of the pattern, and the position of the pattern.

Here, calculation is performed for a case where a cut pattern having a width of 18 nm is exposed. The calculation is performed provided that the pixel pitch Wp is set to 10 nm, the width W of each electron beam included in the one-dimensional array beam A1 is set to 10 nm, and Blur indicating the size of blurring is set to 10 nm.

A left drawing in FIG. 8 shows a case where the proportion between the exposure amounts $\{D_p:D_{p+1}\}$ is set to $\{0:1\}$, and a center drawing in FIG. 8 shows a case where the proportion between the exposure amounts $\{D_p:D_{p+1}\}$ is set to $\{0.2:0.8\}$. A right drawing in FIG. 8 shows a case where the proportion between the exposure amounts $\{D_p:D_{p+1}\}$ is set to $\{0.5:0.5\}$. Moreover, a straight line 98 in the drawings shows a development level.

As shown in the drawings, it is found that, when the proportion between the exposure amounts $D_p$ and $D_{p+1}$ is changed without increasing the total thereof, the line width of the formed pattern hardly changes. It is also found that the center position of the cut pattern changes depending on the proportion between the exposure amounts $D_p$ and $D_{p+1}$.

Next, description is given of a method of determining the proportion between the exposure amounts $D_p$ and $D_{p+1}$ to align the center position of the cut pattern with a target position $X_p$.

The target position $X_p$ can be expressed as $a_p \times r + a_{p+1} \times (1-r)$ by using coordinates $a_p$ and $a_{p+1}$ of the pixel positions and an internal ratio r ($0 \leq r \leq 1$) corresponding to the target position $X_p$. Here, the exposure amounts $D_p$ and $D_{p+1}$ are changed at the same ratio as the internal ratio r. Specifically, the exposure amounts are set based on the following relationship formulae.

$$D_p = D_0 \times r$$

$$D_{p+1} = D_0 \times (1-r)$$

Note that $D_0$ represents a parameter experimentally determined from processing conditions such as a resist condition and a development condition.

Figure 9:
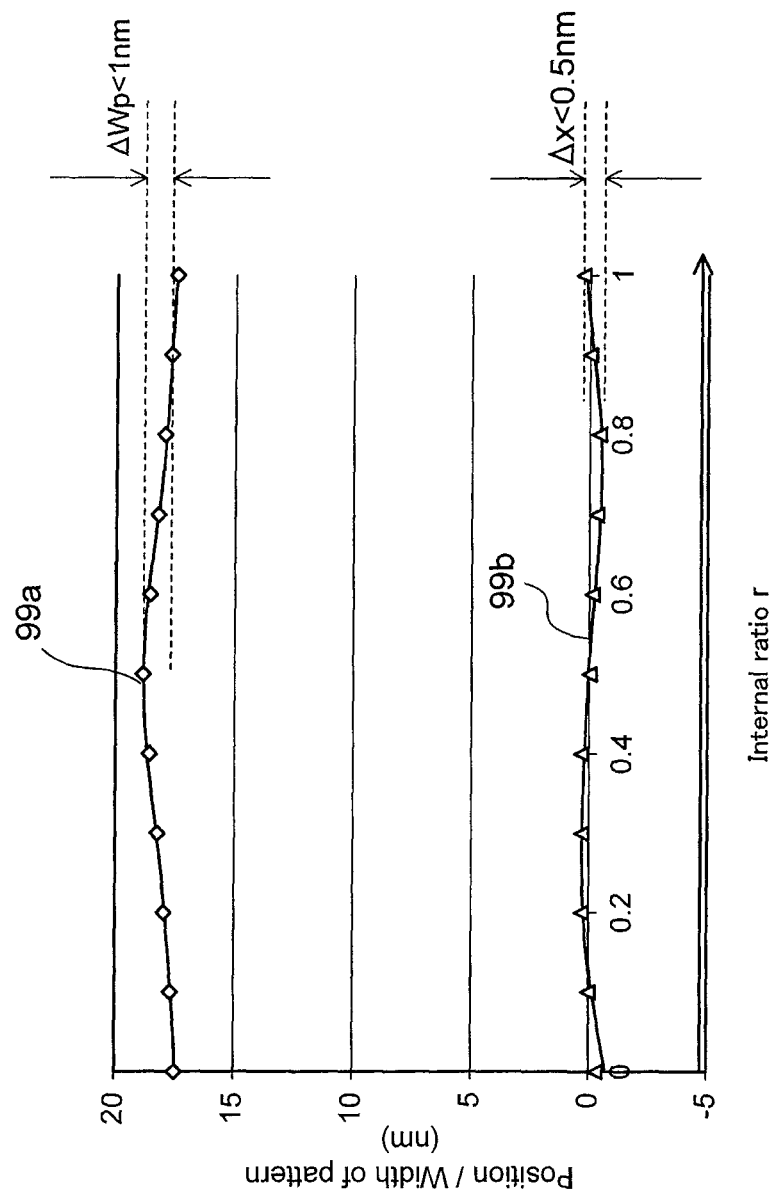
FIG. 9 is a graph in which the horizontal axis represents an internal ratio r and the vertical axis represents the position of a pattern center and a pattern width, and shows a result of obtaining changes of the pattern width and the pattern position in a case where the exposure amounts $D_p$ and $D_{p+1}$ are changed according to the internal ratio r.

FIG. 9 is a graph in which the horizontal axis represents the internal ratio r and the vertical axis represents the position of the pattern center and the pattern width, and shows a result of obtaining changes of the pattern width and the pattern position in a case where the exposure amounts $D_p$ and $D_{p+1}$ are changed according to the internal ratio r. A curved line 99a in FIG. 9 shows a relationship between the internal ratio and the line width. Moreover, the curved line 99b shows how much the position of the pattern center is displaced from the target position $a_p \times r + a_{p+1} \times (1-r)$. Parameters required for the calculation are set to be the same as those in FIG. 9.

As shown in FIG. 9, it is found that, in a case where the exposure amounts $D_p$ and $D_{p+1}$ are changed at the same ratio as the internal ratio r, the line width of the pattern (curved line 99a) is an even function for the internal ratio r about a position of r=0.5, and a variation range $\Delta$Wp of the line width of the pattern is 1 nm at the maximum.

Moreover, it is found that the displacement of the position of the pattern center from the target position (curved line 99b) is an odd function for the internal ratio r about the position of r=0.5, and the displacement from the target position is within a range of 0.5 nm at the maximum.

As described above, a cut pattern can be accurately formed at an arbitrary position between two adjacent pixel positions by changing the exposure amounts $D_p$ and $D_{p+1}$ according to the internal ratio r of the pixel positions.

(3) Method of Determining Parameters

Next, description is given of a method of determining the pixel pitch aw, the width W of the electron beam, the spreading Blur of the exposure amount.

The pixel pitch aw is a pitch which changes the irradiation position of the one-dimensional array beam on an exposure surface and can be appropriately adjusted as an operation parameter of the apparatus. The pixel pitch aw is a value smaller than the width Wp of a pattern to be drawn and is set such that exposed portions overlapping each other are formed when the exposure amounts spread by Blur at the adjacent pixel positions.

The width W of the electron beam is set to a value smaller than the width Wp of the pattern to be drawn (for example, 50% of the pattern width Wp). The width W of the electron beam is determined based on the size of an opening 21a of an aperture plate 21 and the optical magnification of the reduction of the electron beam, and is appropriately set according to the width Wp of the pattern to be drawn.

The spreading Blur of the exposure amount of the electron beam is determined based on the aberration of a projection lens and the spreading of the electron beam in the resist, and is a value determined from characteristics of the projection lens and the resist material.

Using a current column design technique and a state-of-the-art resist can achieve Blur of, for example, 5 nm at minimum. A cut pattern or via pattern having a width of about 9 nm can be drawn by using an electron beam having Blur of 5 nm at minimum and by setting the pixel pitch aw and the width W of the electron beam to 5 nm.

In the case of exposing a pattern having a larger width by using the same electron beam exposure apparatus, the pixel pitch aw are changed to a larger value by changing operation parameters, and the width W of the electron beam is increased by replacing the aperture plate 21 or by adjusting the magnification of reduction. Moreover, Blur of the electron beam can be set to a large value by displacing the focal point of the electron beam with the electromagnetic lenses 12a and 12b.

In a case of doubling the width Wp of the pattern, the pixel pitch aw, the width W of the electron beam, and the spreading Blur of the electron beam are doubled. For example, in a case where the width Wp of the pattern is set to 18 nm, the pixel pitch aw, the width W of the electron beam, and the spreading Blur of the electron beam are each set to 10 nm.

The electron beam exposure apparatus 100 of FIG. 2 is assumed to be operated with a current density of the electron beam EB being always maintained constant. Accordingly, in the electron beam exposure apparatus 100, the adjustment of the exposure amounts $D_p$ and $D_{p+1}$ is performed not by controlling a current value of the electron beam but by controlling an irradiation time (ON time) of the electron beam.

The irradiation time $T_p$ of the electron beam Bn at the p-th pixel position $a_p$ is obtained by the following formula from the current density J(n) and the exposure amount $D_p$ of the electron beam Bn.

$$T_p(n)=D_p/J(n)=D_0\times r/J(n)$$

Moreover, the irradiation time $T_{p+1}$ of the electron beam Bn at the (p+1)th pixel position $a_{p+1}$ is obtained by the following formula.

$$T_{p+1}(n)=D_{p+1}/J(n)=D_0\times(1-r)/J(n)$$

Note that the current density J(n) of the electron beam Bn is obtained by detecting the current value of each of the electron beams Bn included in the one-dimensional array beam and dividing the current value by the area of the irradiation region in advance. Since the current density J may be different among the electron beams B1 to Bn, it is preferable to measure the current density J of each electron beam in advance.

Next, a method of determining a movement speed of the stage 9a is described.

First, an electron beam with the smallest current density J is selected from the electron beams B1 to Bn, and the maximum value $T_m$ of the irradiation time of the electron beam at the p-th pixel position under a condition where the exposure time is longest is obtained based on the smallest current density $J_{min}$. Specifically, the exposure time is longest when the internal ratio r is 1, and the maximum value $T_m$ of this exposure time is $D_0/J_{min}$.

Furthermore, there is a stabilization time $T_w$ of the deflector 8 in case of moving the one-dimensional array beam with the deflector 8.

Accordingly, the maximum time $T_m$ of the exposure time and the stabilization time $T_w$ are required for each pixel position.

Provided that a pixel interval is aw, the most efficient movement speed of the stage is obtained as $aw/(T_m+T_w)$ on the basis of the exposure time $T_m$ and the stabilization time $T_w$ described above.

(4) Control System of Electron Beam Exposure Apparatus

A specific configuration of the control part 101 of the electron beam exposure apparatus 100 is described below.

Figure 10:
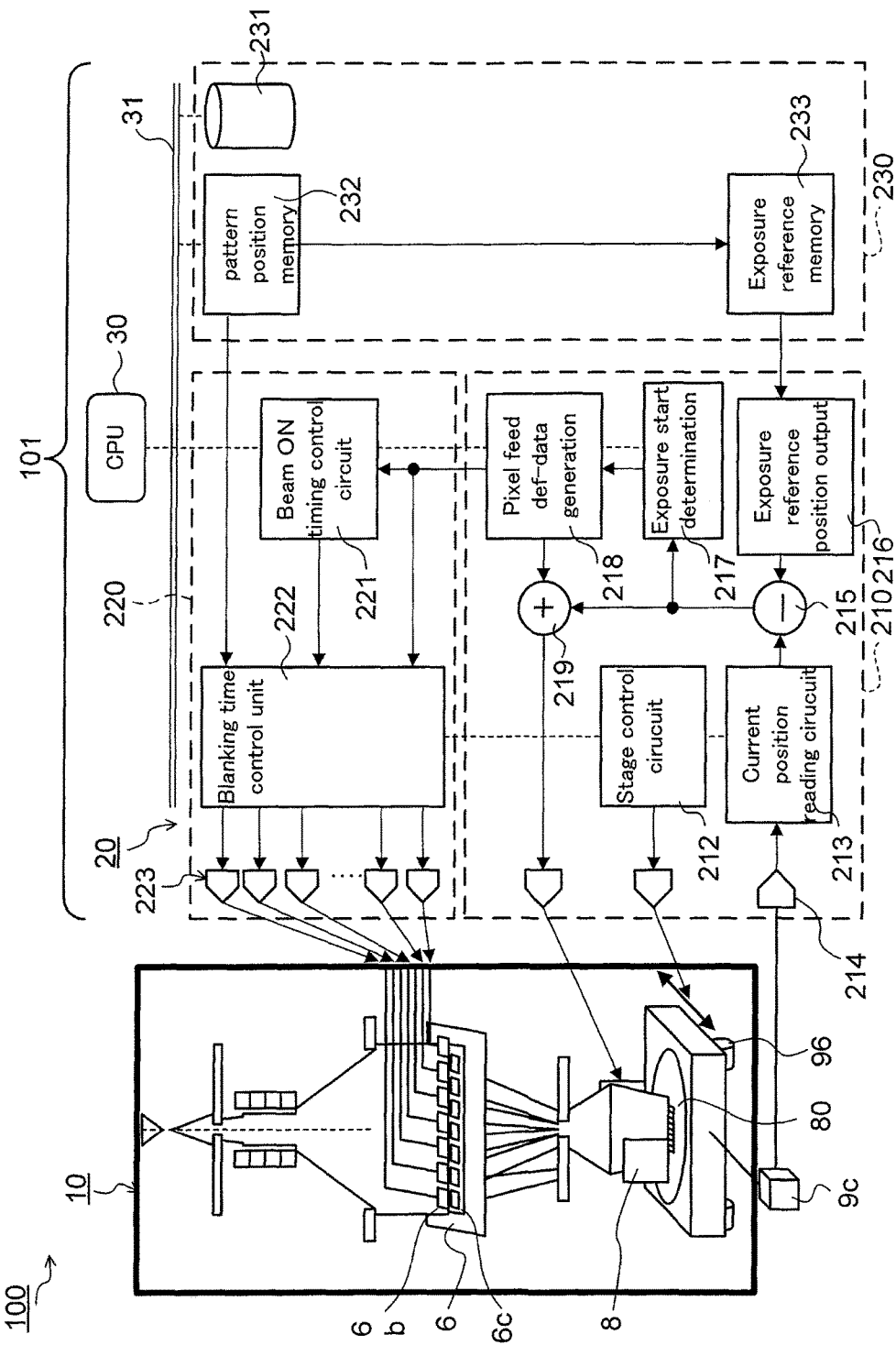
FIG. 10 is a block diagram of a control system in the electron beam exposure apparatus 100 of the embodiment.

FIG. 10 is a block diagram of a control system in the electron beam exposure apparatus 100 of the embodiment.

As shown in FIG. 10, the control part 101 of the electron beam exposure apparatus 100 includes a system controller 20 configured to provide control signals to various parts of the column 10 and an integrated controller (CPU) 30.

The integrated controller 30 is connected to the system controller 20 via a bus 31 and sets operation parameters of various units in the system controller 20. Moreover, the integrated controller 30 monitors activation and operation states of the system controller 20 and performs integrated control of the entire electron beam exposure apparatus 100.

Meanwhile, the system controller 20 includes three main units of a stage position control unit 210, a blanking array control unit 220, and an exposure pattern position storage unit 230.

The stage position control unit 210 includes a current position reading circuit 213 which receives signals from the position sensor 9c via a buffer amplifier 214. The current position reading circuit 213 detects a current position of the column 10 on the semiconductor substrate 80 and sends the detection result to a difference detection circuit 215 and a stage control circuit 212.

The difference detection circuit 215 detects a difference between the current position of the column 10 and the exposure reference position.

Here, the exposure reference position is described by using FIG. 5. In the electron beam exposure apparatus 100 of the embodiment, the frame 86 which is shown in FIG. 4 and in which the exposure is performed in one linear movement is managed by being further divided by a deflection width L into small regions called fields, the deflection width L being a width by which the deflector 8 can deflect the electron beam. Managing coordinate data and the like of the patterns in units of fields which are relatively small as described above can suppress data amounts of patterns and the number of digits in a coordinate value. Hence, the data amount can be an amount easy to handle and quick data processing is thereby made possible. The exposure reference position is a coordinate of the center of each of the aforementioned fields, and the point O in FIG. 5 shows the exposure reference position.

In FIG. 10, an exposure reference position output circuit 216 detects this exposure reference position on the basis of coordinate data of the field which is read from the exposure pattern position storage unit 230 and exposure data of the field which read from an exposure reference position memory 233, and then outputs the detected exposure reference position. The exposure reference position output circuit 216 (see FIG. 10) detects and outputs a new exposure reference position every time a field to which the column 10 belongs changes.

A difference value outputted from the difference detection circuit 215 is sent to an exposure start determination circuit 217 and a deflection data generation circuit 219.

Figure 11:
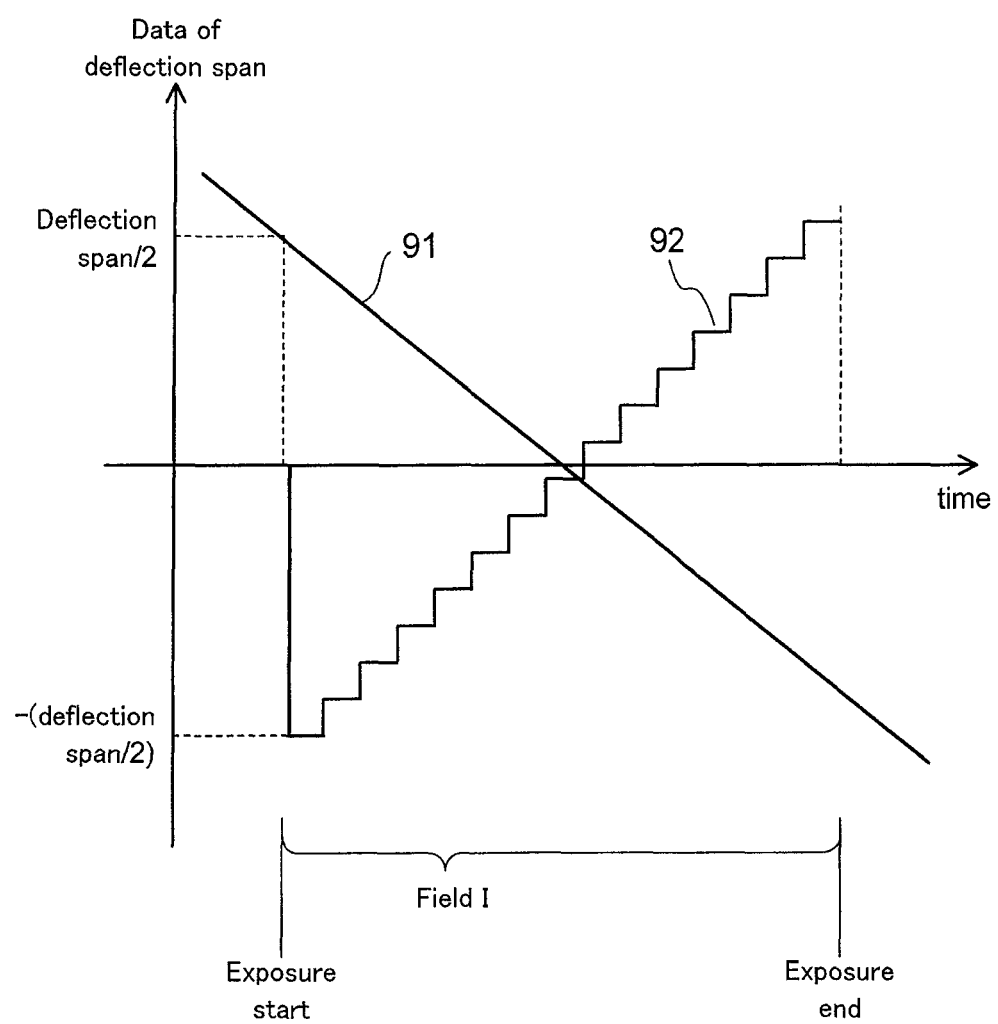
FIG. 11 is a waveform diagram showing an output signal of a difference detection circuit 215 and a pixel feed signal.

FIG. 11 is a waveform diagram showing an output signal of the difference detection circuit 215 and a pixel feed signal outputted by a pixel feed deflection data generation circuit 218.

The exposure start determination circuit 217 determines to start the exposure on the field when the difference value between the current position of the column 10 and the exposure reference position of the field becomes about the half the length of the field. In FIG. 11, reference numeral 91 denotes deflection data corresponding to the difference value. The difference value between the exposure reference position and the current position of the column 10 changes with the movement of the stage 9a, and is inputted into the deflection data generation circuit 219 (see FIG. 10) as the deflection data 91 which is used to move the position of the one-dimensional array beam together with the stage 9a. Meanwhile, the pixel feed deflection data generation circuit 218 generates pixel feed deflection data 92 which is deflection data for each adjacent pixels with the exposure reference position being an origin and which changes stepwise as shown in FIG. 11, and outputs the pixel feed deflection data 92 to the deflection data generation circuit 219.

The deflection data generation circuit 219 combines the difference value data 91 and the pixel feed deflection data 92 and outputs the combined data to the deflector 8.

A deflection output of the deflector 8 can be suppressed to substantially zero by performing such control to set the movement speed of the stage 9a according to the exposure time of each pixel. Hence, the exposure can be performed near the center of the column 10.

In FIG. 10, the blanking array control unit 220 includes a beam-on start timing circuit 221, a blanking time control circuit 222, and driver units 223.

The beam-on start timing circuit 221 provides a synchronized beam-on timing to all of the blanking electrodes. The cycle of a beam-on time is determined depending on a beam-on time of the blanking electrodes and a jumping stabilization waiting time of the electron beam between the pixels.

The beam-on start timing circuit 221 outputs a signal providing a timing to start the irradiation of the electron beam to the blanking time control circuit 222 according to the aforementioned cycle of the beam-on time.

The blanking time control circuit 222 reads the position of the cut pattern or via pattern of each line pattern for each field, from a pattern position memory 232. Then, the blanking time control circuit 222 determines whether to perform exposure at each of the pixel positions or calculates a proportion of the exposure time in the case of performing the exposure, from the positional relationship between the position of the cut pattern or via pattern and the pixel position adjacent thereto, for each of the electron beams B1 to Bn corresponding to the respective line patterns.

Furthermore, the blanking time control circuit 222 outputs the control signal to the driver units 223 on the basis of the timing signal which is sent from the pixel feed deflection data generation circuit 218 and which provides the pixel position and the electron beam-on start timing.

The driver units 223 include drive circuits corresponding to respective blankers of the blanker plate 6. The driver units 223 amplify the output signal of the blanking time control circuit 222 and output the amplified signal to the blankers.

The electron beams B1 to Bn are thus turned on and off according to the pattern position, and the pattern is thereby drawn.

Meanwhile, the exposure pattern position storage unit 230 includes an exposure data storage portion 231, the pattern position memory 232, and the exposure reference position memory 233.

The exposure data storage portion 231 stores the position coordinates of the cut patterns or via patterns in the entire semiconductor substrate 80 as exposure data. The pattern position memory 232 divides the exposure data stored in the exposure data storage portion 231 into units of frames, further divides each piece of exposure data divided into units of frames into units of fields each having a length equal to the deflection width, and stores the thus-divided exposure data.

An exposure reference position coordinate extracted from the exposure data of each field in the pattern position memory 232 is stored in the exposure reference position memory 233.

The pattern position memory 232 then supplies the exposure data in units of field to the blanking time control circuit 222.

(5) Operation of Entire Electron Beam Exposure Apparatus

Next, an exposure operation of the electron beam exposure apparatus 100 is described.

Figure 12:
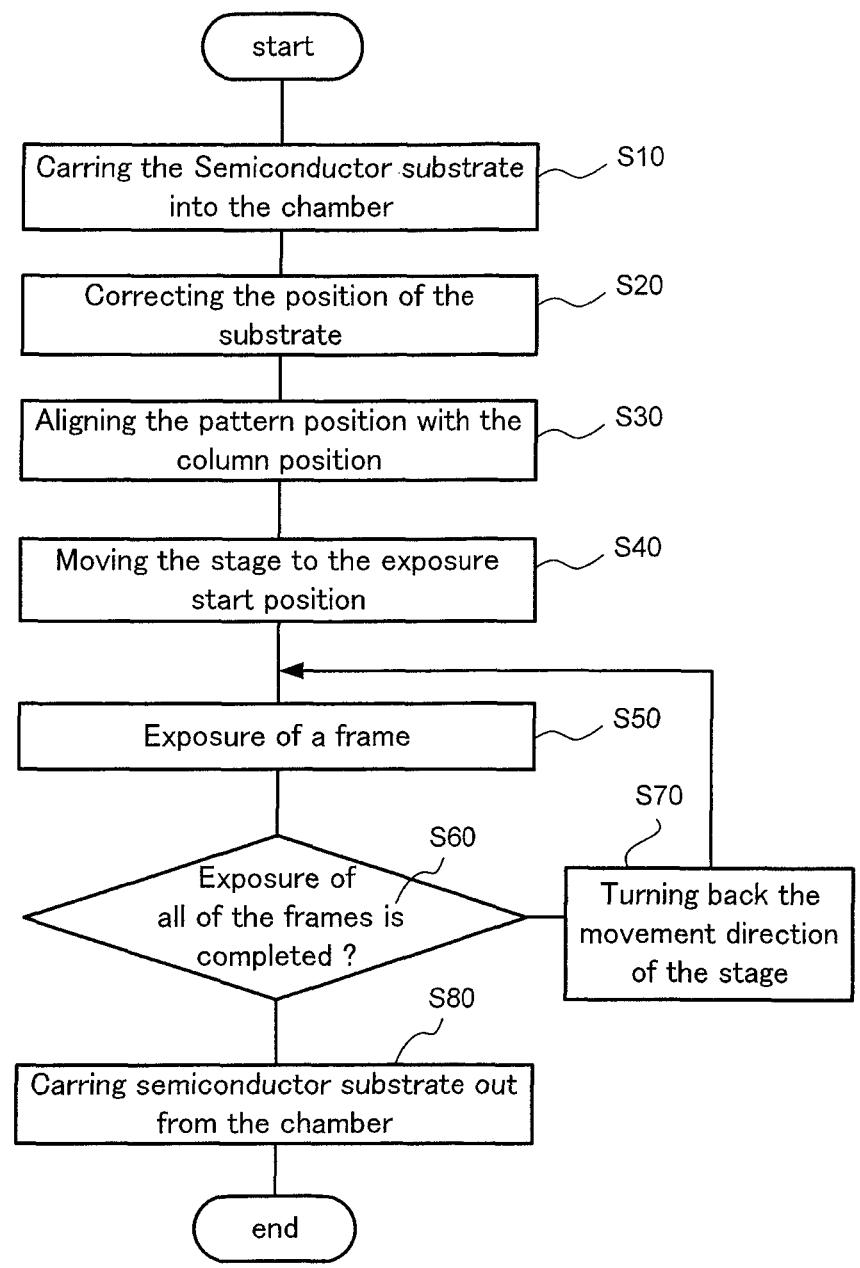
FIG. 12 is a flowchart showing an exposure operation in the electron beam exposure apparatus of the first embodiment.

FIG. 12 is a flowchart showing the exposure operation in the electron beam exposure apparatus 100 of the first embodiment.

First, as shown in FIG. 12, the semiconductor substrate 80 which is the exposure target is carried into the chamber 11 (see FIG. 2) of the electron beam exposure apparatus 100 by being mounted on the stage 9a (step S10).

Next, lateral displacement (offset) of a substrate mounted position of the semiconductor substrate 80 on the stage 9a and displacement (rotation) in a rotation direction is corrected (step S20).

Then, positioning marks provided in advance in a dicing region between chips of the semiconductor substrate 80 are scanned by the electron beams, and the position of the center of the column 10 and the exposure position of the line pattern on the semiconductor substrate 80 are aligned with each other (step S30).

Next, the stage is moved to the exposure start position (step S40).

Then, the exposure of the frame 86 is performed by starting the linear movement of the stage 9a and performing the irradiation of the electron beams with the one-dimensional array beam A1 stopped at the pixel positions of the semiconductor substrate 80 (step S50).

After the exposure of one frame 86 is completed, the operation proceeds to step S60 and the control part determines whether the exposure of all of the frames 86 is completed. If there is a frame 86 not being exposed yet, the operation proceeds to step S70, and the stage 9a is moved to turn back and is moved to the exposure position of the next frame 86. Thereafter, the operation proceeds to step S50 and the exposure of the next frame 86 is performed.

Meanwhile, if the control part determines that the exposure of all of the frames 86 is completed in step S60, the operation proceeds to step S80. In step S80, the semiconductor substrate 80 is carried out from the electron beam exposure apparatus 100 and the exposure operation is completed.

As described above, the electron beam exposure apparatus 100 of the embodiment performs the irradiation of the charged particle beams while moving the one-dimensional array beam in the direction parallel to the line patterns, the one-dimensional array beam includes the plurality of charged particle beams arranged in the direction orthogonal to the line patterns. Since the one-dimensional array beam is used as described above, the number of charged particle beams can be reduced. This improves the usage efficiency of the charged particle beams generated from a charged particle source, and the time required for the exposure can be thus reduced.

Moreover, the rising in the exposure amount distribution can be made steep by performing the irradiation of the charged particle beams while stopping the one-dimensional beam array for a certain period at the pixel positions set at regular intervals on the line patterns, in accordance with the movement of the stage. The cut patterns and the via patterns can be thereby accurately drawn.

Second Embodiment

The first embodiment shows an example in which the exposure amounts $D_p$ and $D_{p+1}$ are linear functions of the internal ratio r. However, the present invention is not limited to this example.

In the embodiment, description is given of an example in which the exposure amounts $D_p$ and $D_{p+1}$ are polynomials of the internal ratio r to further improve the accuracy.

As described with reference to FIG. 9, when the exposure amounts $D_p$ and $D_{p+1}$ are linear functions of the internal ratio r, there is a variation of even function about the position of r=0.5 in the line width.

In view of this, in the embodiment, the variation of the line width of the cut pattern is further reduced as follows. For example, a fourth-order term and a sixth-order term are added as higher-order terms to cancel out an even function term appearing in the variation of the line width of FIG. 9 (curved line 99a).

Moreover, regarding the displacement of the cut pattern, for example, a third-order term and a fifth-order term are similarly added to cancel out the error in the odd function (curved line 99b).

The line width and the displacement from the target position are obtained through calculation for a case where the exposure amounts $D_p$ and $D_{p+1}$ are expressed by the following polynomials of the internal ratio r.

$$D_p = D_0 \times (r - 4 \times R_0 \times r(r-1))$$

$$D_{p+1} = D_0 \times ((1-r) - 4 \times R_0 \times r(r-1))$$

Figure 13:
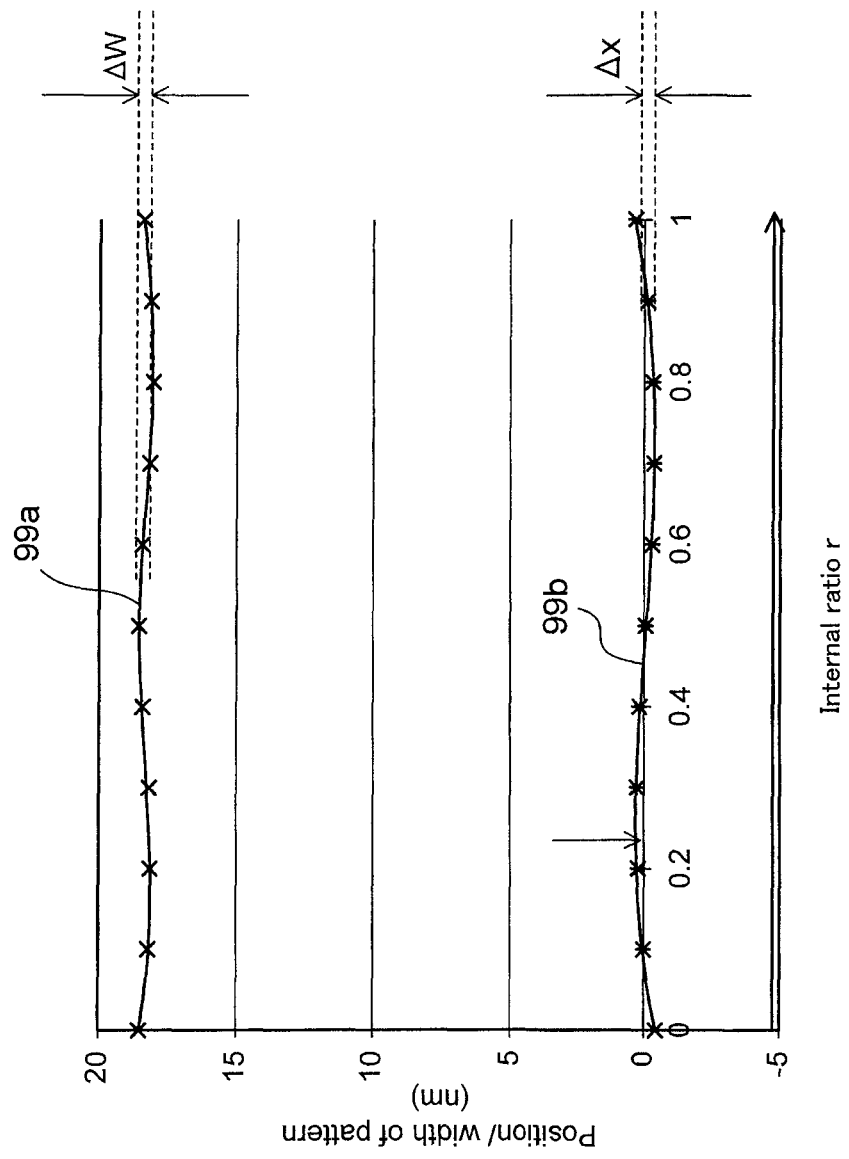
FIG. 13 is a graph showing a result of obtaining the line width and displacement from the target position through calculation in a case where the exposure amounts $D_p$ and $D_{p+1}$ are expressed by polynomials of the internal ratio r.

In the above polynomials, $D_0$ is a constant determined from processing conditions such as resist and development, and $R_0$ is a constant within a range of $0 < R_0 \leq 0.1$ FIG. 13 is a graph showing a result of obtaining the line width and the displacement from the target position through calculation in the case where the exposure amounts $D_p$ and $D_{p+1}$ are expressed by the polynomials of the internal ratio r. Here, the calculation is performed with R set to 0.05, the beam width set to 10 nm, and Blur set to 10 nm.

As shown in FIG. 13, it is found that the displacement amount of the cut pattern from the target position can be suppressed to 0.3 nm or less and also that the variation range of the width of the cut pattern to the target value is suppressed to be 0.5 nm or less.

Third Embodiment

Figure 14:
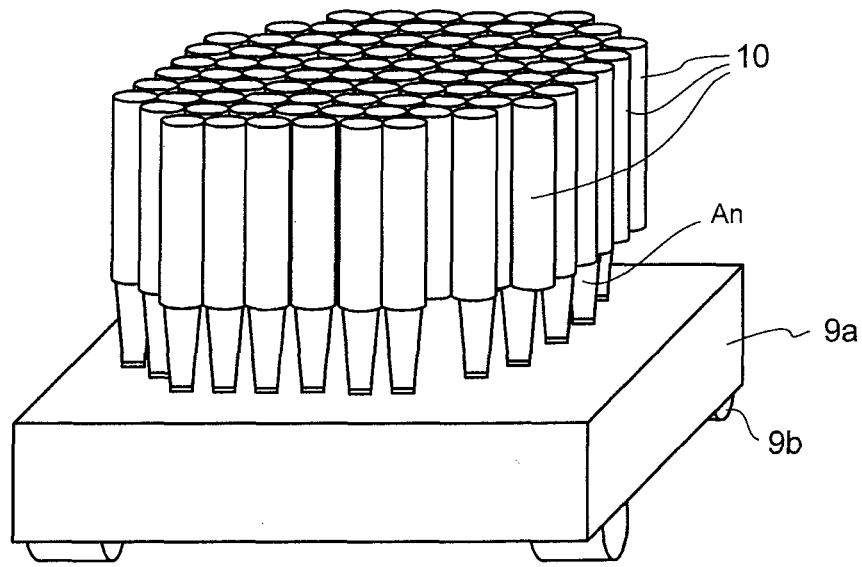
FIG. 14 is a perspective view showing a main portion of an electron beam exposure apparatus of a third embodiment.

FIG. 14 is a perspective view showing a main portion of an electron beam exposure apparatus of a third embodiment.

As shown in FIG. 14, in the embodiment, a plurality of the columns 10 are arranged above the stage 9a. The structure of each of the columns 10 is the same as that of the column 10 shown in FIG. 3. Each column 10 can be formed to have a diameter of about 30 mm for example.

Figure 15:
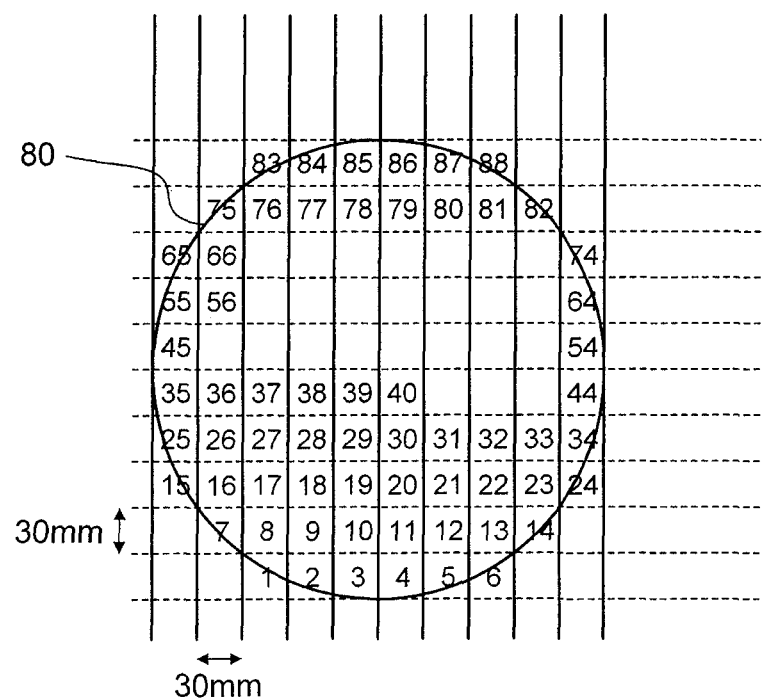
FIG. 15 is a plan view showing regions in which the respective columns perform exposure when the columns each having a diameter of 30 mm are arranged on a semiconductor substrate having a diameter of 300 mm.

FIG. 15 is a plan view showing regions in which the respective columns 10 perform exposure when the columns each having a diameter of 30 mm are arranged on a semiconductor substrate having a diameter of 300 mm.

As shown in FIG. 15, 88 columns 10 can be arranged on the semiconductor substrate 80 having the diameter of 300 mm, and each of the columns 10 performs exposure on a region of 30 mm×30 mm. In the embodiment, since the plurality of columns 10 can perform exposure in parallel with each other, the exposure of cut patterns or via patterns can be more quickly performed.

A description is given below of an example of calculating the throughput of the electron beam exposure apparatus of the embodiment.

As operation conditions of the electron beam exposure apparatus, an interval aw between the adjacent pixel positions is set to 10 nm, the current density of the electron beams B1 to Bn is set to 400 A/cm², the width of each of the field (which is the width of the one-dimensional array beam and is also the deflection width of the deflector 8) is set to 30 μm×30 μm, the exposure region of each column 10 is set to 30 mm×30 mm, and the deflection stabilization waiting time for the jump of the one-dimensional array beam between the adjacent pixel positions is set to 10 nsec. Moreover, the threshold of the exposure amount by which the resist is developed is set to 40 μC/cm² as a processing condition.

In this case, the maximum value of the irradiation time of the electron beam at each pixel position is (40 μC/cm²)/(400 nA/cm²)=100 nsec. The processing time for each pixel position including the deflection stabilization waiting time is 100 nsec+10 nsec=110 nsec.

The number of pixel positions in one field is 30 μm/10 nm=3000. Accordingly, the time required for the exposure of one field is 110 ns×3000=330 μsec.

From the calculation result described above, the movement speed (average speed) of the stage is 30 μm/330 μsec=91 mm/sec. The exposure time of one frame is 30 mm/(91 mm/sec)=330 msec. The number of frames in the exposure region is 30 mm/30 μm=1000. Accordingly, the time required for the drawing of the entire exposure region is 330 msec×1000=330 sec. Since the time required for carrying-in, adjustment, carrying-out, and the like of the semiconductor substrate is about 30 seconds, the processing time of one semiconductor substrate is 330 seconds+30 seconds=360 seconds.

The electron beam exposure apparatus of the embodiment can thus process 3600 seconds/360 seconds=10 semiconductor substrates per hour.

Other Embodiments

In the embodiments described above, description is given by using examples of the exposure apparatus and exposure method which use electron beams as the charged particle beams. However, the present invention is not limited to this. For example, various charged particles such as ion beams can be used as beams for exposure instead of the electron beams.

Moreover, it is possible to employ an embodiment in which part of constitutional elements are changed within a scope of a technical sprit disclosed by the description.

What is claimed is:

1. A charged particle beam exposure apparatus configured to expose cut patterns or via patterns on a substrate having a plurality of line patterns arranged on an upper surface of the substrate at a constant pitch, the cut patterns provided to cut the line patterns, the via patterns provided to form via holes on the line patterns, the charged particle beam exposure apparatus comprising:
a charged particle source configured to emit charged particles;
an aperture plate having a plurality of openings arranged in one row and in a one-dimensional direction orthogonal to the line patterns, the aperture plate configured to form a one-dimensional array beam in which charged particle beams formed of the charged particles having passed through the openings are arranged in array in the one-dimensional direction;
a blanker plate including a blanker array configured to independently deflect in a blanking manner the charged particle beams included in the one-dimensional array beam;
a final aperture plate configured to block the charged particle beams deflected by the blanker array;
a deflector configured to adjust an irradiation position of the entire one-dimensional array beam;
a stage including a drive mechanism configured to hold and move the substrate; and
a control part configured to control operations of the blanker plate, the deflector, and the stage,
wherein the control part causes the stage to continuously move in a direction parallel to the line patterns and, at the same time, performs irradiation of the charged particle beams over a frame in one linear movement while stopping the one-dimensional array beam at a pixel position on the substrate, where the pixel position is set at regular intervals on the line pattern, for a certain period, in accordance with the movement of the stage; and
wherein, while performing exposure across one frame, irradiation position of the one-dimensional array beam, on the substrate, is fixed in a direction perpendicular to that of the movement of the stage and is moved in a stepwise manner in the direction parallel to that of the movement of the stage; and
wherein exposure of one of the pattern of a plurality of patterns arranged in the line pattern is performed by irradiation at one or two pixel positions.

2. The charged particle beam exposure apparatus according to claim 1, wherein the intervals of the pixel positions are set such that blurring portions of each of the charged particle beams overlap each other.

3. The charged particle beam exposure apparatus according to claim 2, wherein the control part draws each of the cut patterns or the via patterns at an arbitrary position between adjacent two of the pixel positions, by using overlapping of portions of irradiation amount distribution of a corresponding one of the charged particle beams at the adjacent two pixel positions.

4. The charged particle beam exposure apparatus according to claim 2, wherein the control part draws each of the cut patterns or the via patterns at an arbitrary position between adjacent two of the pixel positions, by adjusting a proportion between irradiation times of a corresponding one of the charged particle beams respectively at the adjacent two pixel positions with the blanker plate.

5. The charged particle beam exposure apparatus according to claim 4, wherein the control part obtains a proportion between irradiation amounts of the corresponding charged particle beam respectively at the adjacent two pixel positions from a polynomial of an internal ratio of a pattern position for the adjacent two pixel positions.

6. The charged particle beam exposure apparatus according to claim 5, wherein, provided that $a_p$ and $a_{p+1}$ represent a pixel position and a pixel position adjacent thereto, respectively, and that a position of a pattern to be drawn is expressed as $a_p \times r + a_p \times (1-r)$ by using an internal ratio r, the control part obtains an exposure amount $D_p$ at the pixel position $a_p$ and an exposure amount $D_{p+1}$ at the pixels position $a_{p+1}$ from relationship formulae of $$D_p = D_0 \times (r - 4 \times R_0 \times r(1-r))$$

$$D_{p+1} = D_0 \times ((r-1) - 4 \times R_0 \times r(1-r))$$

(where $D_0$ is a constant determined from a resist material and a development condition and $R_0$ is a constant determined within a range of $0 < R_0 \leq 0.1$).

7. The charged particle beam exposure apparatus according to claim 2, further comprising a focus lens configured to adjust focal positions of the charged particle beams, wherein the control part adjusts sizes of the blurring (blur) portions of the charged particle beams by displacing a focal position of the focus lens.

8. The charged particle beam exposure apparatus according to claim 1, wherein the control unit:
obtains the number P of pixel positions included in a deflection width L by dividing the deflection width L by a distance between the pixel positions, the deflection width L being a width by which the deflector is capable of deflecting the one-dimensional array beam in the line pattern direction;
obtains a stop time T at each of the pixel positions by adding a beam deflection stabilization waiting time to a beam irradiation time obtained by dividing an exposure amount required for exposure of the cut pattern or the via pattern by a current density of the charged particle beam: and
sets a movement speed of the stage to $L/(T \times P)$.

9. A method of manufacturing a semiconductor device, comprising a step of exposing cut patterns or via patterns on a substrate having a plurality of line patterns arranged on an upper surface of the substrate at a constant pitch, the cut patterns provided to cut the line patterns, the via patterns provided to form via holes on the line patterns, the exposure performed by using a charged particle beam exposure apparatus including: a charged particle source configured to emit charged particles; an aperture plate having a plurality of openings arranged in one row and in a one-dimensional direction orthogonal to the line patterns, the aperture plate configured to form a one-dimensional array beam in which charged particle beams formed of the charged particles having passed through the openings are arranged in array in the one-dimensional direction; a blanker plate including a blanker array configured to independently deflect in a blanking manner the charged particle beams included in the one-dimensional array beam; a final aperture plate configured to block the charged particle beams deflected by the blanker array; a deflector configured to adjust an irradiation position of the entire one-dimensional array beam; a stage including a drive mechanism configured to hold and move the substrate; and a control part configured to control operations of the blanker plate, the deflector, and the stage, wherein the stage is continuously moved in a direction parallel to the line patterns and, at the same time, irradiation of the charged particle beams over a frame in one linear movement is performed with the one-dimensional array beam at a pixel position being stopped on the substrate, where the pixel position is set at regular intervals on the line pattern, for a certain period, in accordance with the movement of the stage; and wherein, while performing exposure across one frame, irradiation position of the one-dimensional array beam, on the substrate, is fixed in a direction perpendicular to that of the movement of the stage and is moved in a stepwise manner in the direction parallel to that of the movement of the stage; and wherein exposure of one of the pattern of a plurality of patterns arranged in the line pattern is performed by irradiation at one or two pixel positions.

10. The method of manufacturing a semiconductor device according to claim 9, wherein the intervals of the pixel positions are set such that blurring (blur) portions of each of the charged particle beams overlap each other.

11. The method of manufacturing a semiconductor device according to claim 10, wherein each of the cut patterns or the via patterns is drawn at an arbitrary position between adjacent two of the pixel positions, by using overlapping of portions of irradiation amount distribution of a corresponding one of the charged particle beams at the adjacent two pixel positions.

12. The method of manufacturing a semiconductor device according to claim 10, wherein each of the cut patterns or the via patterns is drawn at an arbitrary position between adjacent two of the pixel positions, by adjusting a proportion between irradiation times of a corresponding one of the charged particle beams respectively at the adjacent two pixel positions.

13. The method of manufacturing a semiconductor device according to claim 12, wherein a proportion between irradiation amounts of the corresponding charged particle beam respectively at the adjacent two pixel positions is obtained from a polynomial of an internal ratio of a pattern position for the adjacent two pixel positions.

14. The method of manufacturing a semiconductor device according to claim 13, wherein, provided that a position of a pattern to be drawn for a pixel position $a_p$ and a pixel position $a_{p+1}$ adjacent thereto is expressed as $a_p \times r + a_p \times (1-r)$ by using an internal ratio r, the control part obtains an exposure amount $D_p$ at the pixel position $a_p$ and an exposure amount $D_{p+1}$ at the pixels position $a_{p+1}$ from $$D_p = D_0 \times (r - 4 \times R_0 \times r(1-r))$$

$$D_{p+1} = D_0 \times ((r-1) - 4 \times R_0 \times r(1-r))$$

(where $D_0$ is a constant determined from a resist material and a development condition and $R_0$ is a constant determined within a range of $0 < R_0 \leq 0.1$).

* * * * *